(12) United States Patent
Guler et al.

(10) Patent No.: US 12,405,526 B2
(45) Date of Patent: Sep. 2, 2025

(54) EXTREME ULTRAVIOLET LITHOGRAPHY PATTERNING WITH ASSIST FEATURES

(71) Applicant: Intel Corporation, Santa Clara, CA (US)

(72) Inventors: Leonard Guler, Hillsboro, OR (US); Tahir Ghani, Portland, OR (US); Charles Wallace, Portland, OR (US); Hossam Abdallah, Portland, OR (US); Dario Farias, Portland, OR (US); Tsuan-Chung Chang, Portland, OR (US); Chia-Ho Tsai, Hillsboro, OR (US); Chetana Singh, Portland, OR (US); Desalegne Teweldebrhan, Sherwood, OR (US); Robert Joachim, Beaverton, OR (US); Shengsi Liu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 920 days.

(21) Appl. No.: 17/358,446

(22) Filed: Jun. 25, 2021

(65) Prior Publication Data
US 2022/0413376 A1    Dec. 29, 2022

(51) Int. Cl.
*G03F 1/22* (2012.01)
*G03F 7/20* (2006.01)
(Continued)

(52) U.S. Cl.
CPC .............. *G03F 1/22* (2013.01); *G03F 7/2004* (2013.01); *G03F 7/2026* (2013.01); *H01L 21/0337* (2013.01); *H01L 21/31144* (2013.01)

(58) Field of Classification Search
None
See application file for complete search history.

(56) References Cited

U.S. PATENT DOCUMENTS

| 9,252,022 B1 | 2/2016 | Dechene et al. |
| 10,014,297 B1 | 7/2018 | Sun et al. |

(Continued)

FOREIGN PATENT DOCUMENTS

DE    102019118368    6/2020

OTHER PUBLICATIONS

Extended European Search Report from European Patent Application No. 22163744.0 notified Sep. 8, 2022, 7 pgs.
(Continued)

*Primary Examiner* — Binh X Tran
(74) *Attorney, Agent, or Firm* — Essential Patents Group, LLP

(57) ABSTRACT

Techniques for improved extreme ultraviolet (EUV) patterning using assist features, related transistor structures, integrated circuits, and systems, are disclosed. A number of semiconductor fins and assist features are patterned into a semiconductor substrate using EUV. The assist features increase coverage of absorber material in the EUV mask, thereby reducing bright field defects in the EUV patterning. The semiconductor fins and assist features are buried in fill material and a mask is patterned that exposes the assist features and covers the semiconductor fins. The exposed assist features are partially removed and the protected active fins are ultimately used in transistor devices.

20 Claims, 9 Drawing Sheets

(51) Int. Cl.
*H01L 21/033* (2006.01)
*H01L 21/311* (2006.01)

(56) References Cited

U.S. PATENT DOCUMENTS

| | | |
|---|---|---|
| 11,121,138 B1 * | 9/2021 | Chiu .................. H01L 21/0338 |
| 11,264,268 B2 | 3/2022 | Yang et al. |
| 2019/0088551 A1 * | 3/2019 | Kim .................. H10D 84/0151 |
| 2021/0184051 A1 | 6/2021 | Trivedi et al. |
| 2021/0336046 A1 * | 10/2021 | Wang .................. H10D 30/794 |

OTHER PUBLICATIONS

Office Action from European Patent Application No. 22163744.0 notified May 30, 2025, 7 pgs.

* cited by examiner

EXTREME ULTRAVIOLET LITHOGRAPHY PATTERNING WITH ASSIST FEATURES

BACKGROUND

In extreme ultraviolet (EUV) lithography, EUV mask defects provide patterning difficulties, particularly for bright field patterning. For example, the process used to generate the EUV mask begins with a blank that is covered with a patterned absorber material, which has a pattern to be transferred during lithography processing. Notably, the mask blank has unavoidable, very small defects that may be covered by the absorber material or not, depending on the feature layout of the mask. Uncovered defects may be patterned or printed during lithography processing. In bright field patterning contexts (e.g., low pattern density layouts) such patterned or printed defects are of particular concern as they cause process issues and larger numbers of defects during lithography processing. Such defect issues cause a variety of problems in semiconductor manufacturing such as yield problems, reliability issues, and so on. Due to the greater coverage of absorber material on the EUV mask, the discussed defect problems are not as great in the context of dark field patterning.

There is an ongoing desire to transfer low density field patterns (i.e., bright field pattern layouts) for final products in semiconductor processes with low defects and high manufacturability. It is with respect to these and other considerations that the present improvements have been needed. Such improvements may become critical to improve transistors for higher performance integrated circuit in electronic devices.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
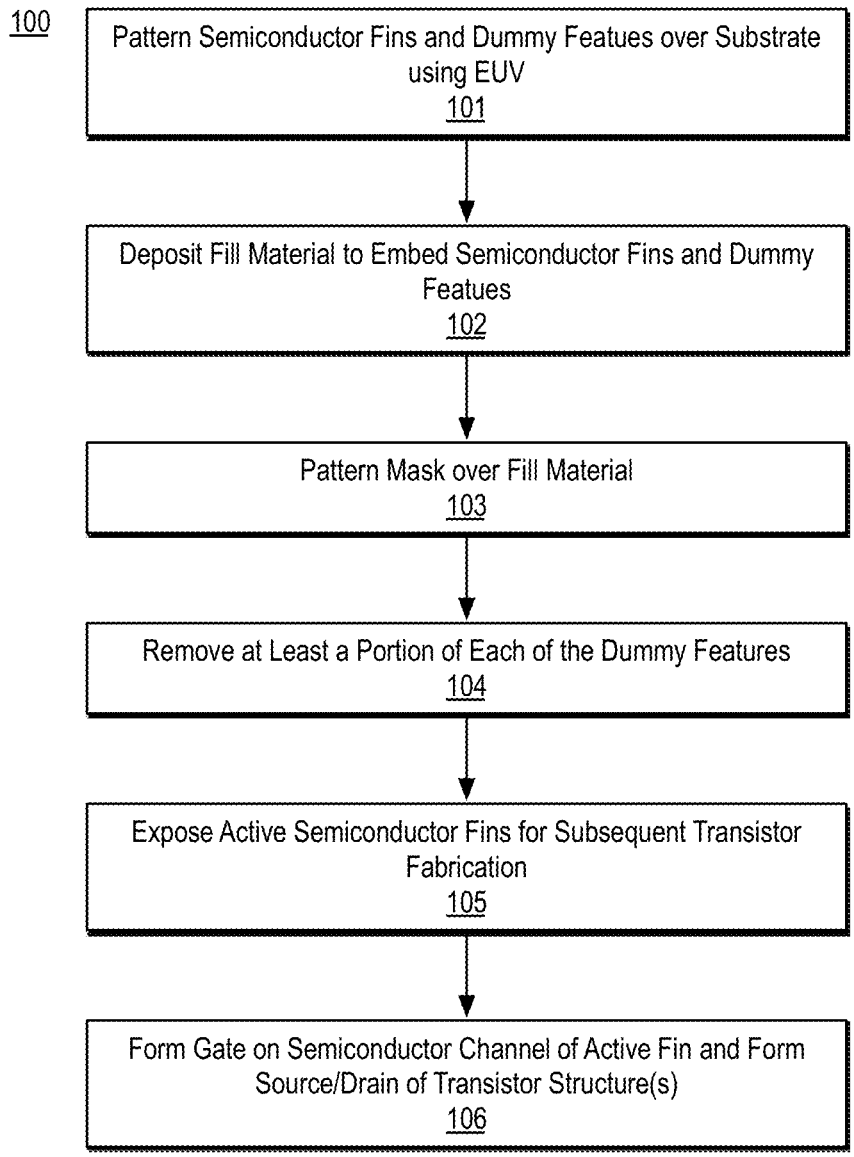
FIG. 1 provides a flow diagram illustrating an example process for fabricating transistor structures using extreme ultraviolet lithography with sacrificial assist features.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized, and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. The term immediately adjacent indicates such features are in direction contact. Furthermore, the terms "substantially," "close," "approximately," "near," and "about," generally refer to being within +/−10% of a target value. The term layer as used herein may include a single material or multiple materials. As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Semiconductor processing techniques, transistor structures, integrated circuits, devices, and computing platforms are described herein related to EUV patterning with assist features and, in particular, to patterning active fin features and assist features between the active fin features for reduced defects, and subsequently removing the dummy features prior to formation of transistors using the active fin features.

As discussed, the fabrication process for EUV masks has defectivity issues, particularly with bright field patterning. Furthermore, particular semiconductor manufacturing layers are inherently low density, which is difficult for EUV mask design due to the defectivity issues. As discussed herein, in some embodiments, dummy features are provided on the EUV mask in such semiconductor manufacturing layers to increase feature density and/or area on the EUV mask and reduce visible defects of the mask blank that would otherwise be exposed. For example, extra features (e.g., dummy features) are included on the EUV mask (e.g., reticle mask) and the resultant patterned extra features are subsequently removed in the semiconductor manufacturing process. Such extra features may be characterized as dummy features, assist features, or the like.

In some embodiments, semiconductor fins and dummy features (of the same semiconductor material) are patterned over and/or in a substrate using extreme ultraviolet (EUV) lithography (e.g., in the same EUV patterning). The semiconductor fins and dummy features may be patterned using direct print technique, for example, by patterning EUV resist over a semiconductor substrate (and optional hardmask and/or oxide layer thereon). The pattern of the EUV may be used directly or transferred to a hardmask. In either case, the pattern of the EUV reticle is transferred to the substrate, for example, using etch techniques to form the semiconductor fins and dummy features. Notably, a greater feature density and/or area is used in the EUV lithography than the semiconductor fins used for generating transistor structures. Thereby, the EUV patterning is improved as defects that would otherwise be exposed are covered by absorber material for the dummy features. For example, the EUV patterning includes the active fins and the assist or dummy features instead of the active fins only for reduced defectivity. Following the patterning of the semiconductor fins and dummy features, the semiconductor fins and dummy features are embedded in a fill material. A mask is patterned over the fill material such that the active semiconductor fins are under regions covered by the mask and the dummy features are under regions exposed by the mask. In some embodiments, the mask is a hardmask patterned using a photoresist mask transferred to the hardmask.

As used herein, the term active fin indicates a fin that is to be contacted by other components of a transistor such as a gate structure, a source, and a drain. The term fin is inclusive of fin channel devices and nanoribbon devices fabricated from fin structures. The term assist feature, dummy feature, and similar terms (inclusive of dummy fins, if employed) indicate a feature that is to be at least partially removed and is not to be contacted by any active component of the transistor such as the gate structure, the source, or the drain. Instead, any subfin portion of a removed dummy feature is embedded in dielectric material and isolated from the active fins, the gate structure, the source, the drain, etc.

The exposed dummy features and exposed portions of the fill material are then removed (e.g., using etch processing) while covered, active semiconductor fins remain. Such processing reduces density and provides a final semiconductor fin pattern for transistor fabrication. In some embodiments, the dummy features are not fully removed and subfin structures remain, which may be embedded in dielectric material prior to fabrication of transistor components such as source, drain, and gate structures.

As illustrated herein, in some embodiments, such fin structures may be deployed to provide a channel region of a transistor or transistor structure. For example, a portion of the fin structure (e.g., a top fin portion) may be deployed as a semiconductor channel of an active transistor device. In other embodiments, the fin structures may include a multi-layer stack of materials such as alternating layers of semiconductor material and sacrificial material. The sacrificial material may be subsequently removed, leaving nanoribbons of semiconductor material. A gate all around gate structure may be formed around the nanoribbons and the nanoribbons may be contacted by a source and a drain, as is known in the art. For example, resultant transistor structures may be multi-gate devices having a gate structure contacting a fin or fin portion (as illustrated herein) or one or more nanoribbons. In either case, assist features (or dummy features) are deployed to increase feature density in the EUV patterning to provide dark field patterning for improved manufacturability. The assist features are then removed leaving active fin structures, which may be deployed, for example, as channel regions of fins or as channel regions of nanoribbons in a resultant transistor device.

FIG. 1 provides a flow diagram illustrating an example process 100 for fabricating transistor structures using extreme ultraviolet lithography with sacrificial assist features, arranged in accordance with at least some implementations of the present disclosure. For example, process 100 may be implemented to fabricate a transistor structure 700 or any other transistor structure discussed herein. In the illustrated embodiment, process 100 includes one or more operations as illustrated by operations 101-106. However, embodiments herein may include additional operations, certain operations being omitted, or operations being performed out of the order provided. In various embodiments, process 100 may fabricate transistor structure 700 as discussed further herein with respect to FIGS. 2-7. However, process 100 may be used to fabricate any transistor structures herein.

FIGS. 2, 3, 4, 5, 6, and 7 illustrate top-down and selected cross-sectional side views of example transistor structures as particular fabrication operations using extreme ultraviolet lithography with sacrificial assist features are performed, arranged in accordance with at least some implementations of the present disclosure. Discussion of process 100 will be made with respect to such exemplary embodiments; however, other transistor structures may be formed using the operations of process 100.

Process 100 begins at operation 101, where a number of semiconductor fins and corresponding assist features are patterned in a substrate using EUV. As discussed, such EUV patterning can suffer from defects in bright field patterning. At operation 101, dark field patterning is deployed by patterning active semiconductor fins along with a number assist or dummy features. As used herein, the terms assist features or dummy features are used interchangeably and indicate patterned features that are later at least partially removed.

The semiconductor fins and assist features may be patterned using any suitable EUV techniques. In some embodiments, the semiconductor fins and assist features are patterned using direct print EUV. For example, a mask such as a resist mask or hardmask may be patterned over the substrate using single direct (e.g., single pass) EUV lithography. In the context of hardmask usage, the pattern may be transferred from a photoresist pattern to an underlying hardmask layer. For example, the pattern may be transferred directly to a photoresist mask that is used as an etch mask or the photoresist mask pattern may be transferred to a hardmask.

In either case, the pattern is transferred from an EUV reticle that includes a greater density and area of absorber material due to the pattern including the assist features. The resultant mask is then deployed as an etch mask to etch a top portion of the substrate to form semiconductor fins and assist features. The substrate may include any suitable material and, in some embodiments, the substrate has the same or a similar composition with respect to a semiconductor channel region to be formed in the patterned fins. In some embodiments, the substrate and channel regions include a Group IV material (e.g., silicon). In some embodiments, the substrate and channel regions include a substantially monocrystalline material. In some embodiments, substrate 201 includes a buried insulator layer (e.g., $SiO_2$), for example, of a semiconductor-on-insulator (SOI) substrate. Other semiconductor materials may be deployed.

Notably, additional etch mask features are formed corresponding to assist features for improved EUV lithography due to lower defectivity. The EUV direct patterned lines used for fin features may have any suitable widths and pitches attainable using EUV lithography patterning. In some embodiments, the patterned lines have widths in the range of 5 to 10 nm and pitches in the range of 10 to 15 nm.

The patterned regions for the dummy features extend between the patterned lines of fin features in any suitable shape. For example, the patterned lines for fin features may be in accordance with a desired transistor layout and the dummy features may be in the regions therebetween. In some embodiments, a minimum available between distance (e.g., 5 to 10 nm) may be used as a minimum distance between an edge of a patterned lines for a fin feature and an edge of a patterned region for an adjacent dummy feature. In some embodiments, an additional buffer (e.g., 1 to 5 nm) is provided between patterned lines features and adjacent patterned dummy features.

Figure 2:
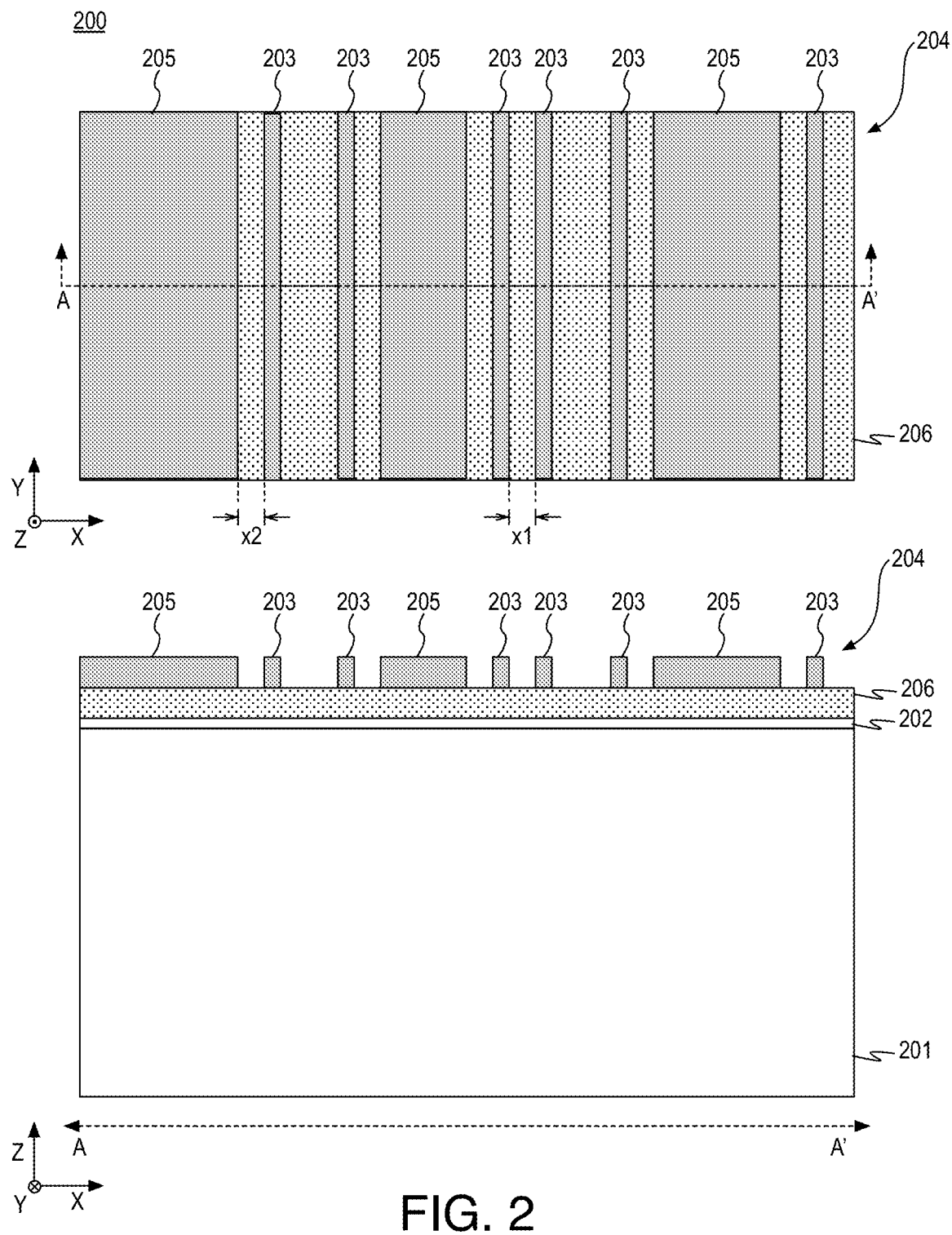
FIG. 2 illustrates an example transistor structure after patterning a mask inclusive of a number of fin feature structures and assist feature structures using EUV lithography.

FIG. 2 illustrates an example transistor structure 200 after patterning a mask 204 inclusive of a number of fin feature structures 203 and assist feature structures 205 using EUV lithography. In FIG. 2, as well as FIGS. 3-7, a top-down view is illustrated along with a cross sectional view taken along a A-A' cross sectional plane (e.g., in the x-z plane) in the top-down view. As used herein the term parallel with respect to line features, fins, etc. indicates the structures have substantially the same distance therebetween along a direction of the features such as being at substantially the same distance in the x-dimension along the y-direction of the features in FIG. 2. In some embodiments, one or more of fin feature structures 203 are patterned as parallel lines in a partial grating structure. Mask 204 may be any suitable material such as photoresist material and mask 204 may be patterned using any suitable EUV patterning techniques. In the context of mask 204, features and structures may be isolated from other features or not, with features and structures in such contexts being portions of a mask layer.

In the illustrated embodiment, mask 204 is formed on a hardmask material 206 (or hardmask layer or, simply, hardmask), which is, in turn, on an optional oxide layer 202, over substrate 201. As discussed substrate 201 (or a top portion thereof) includes a semiconductor material that is to be utilized as a channel material in a transistor device. For example, substrate 201 may be silicon or another semiconductor material such as III-V semiconductor materials, or others. In the illustrated example, fin feature structures 203 of mask 204 have the same widths in the x-dimension. However, fin feature structures 203 may have differing widths. Furthermore, as shown with respect to inter-fin feature dimension, x, fin feature structures 203 may have a minimum dimension therebetween. Also as shown, each of assist feature structures 205 of mask 204 extends from a particular distance of each fin feature structures 203 bounding assist feature structure 205. As shown, in some embodiments, each of assist feature structures 205 may be within inter-fin feature dimension, x1, of each of the adjacent fin feature structures 203. In some embodiments, inter-fin feature dimension, x1, is the minimum resolvable distance between features of mask 204 that can be attained using EUV. In some embodiments, the inter-fin feature dimension, x1, is employed in mask 204 as a distance between fin structures and assist structures (i.e., x2=x1). In some embodiments, the distance between fin structures and assist structures, x2, provides a buffer over the minimum resolvable distance. In some embodiments, the distance between fin structures and assist structures, x2, is 20% greater than the inter-fin feature dimension, x1, or minimum resolvable distance (i.e., x2=1.2×1). In some embodiments, the distance between fin structures and assist structures, x2, is 50% greater than the inter-fin feature dimension, x1, or minimum resolvable distance (i.e., x2=1.5×1). In some embodiments, the distance between fin structures and assist structures, x2, is 80% greater than the inter-fin feature dimension, x1, or minimum resolvable distance (i.e., x2=1.8×1). Other buffer ratios may be used.

In the example of FIG. 2, parallel fin feature structures 203 are formed over substrate 201 and on hardmask material 206 that is on optional oxide layer 202, such as a protective oxide layer. In some embodiments, the pattern of mask 204 is to be transferred to a top portion of substrate 201 to provide active semiconductor fins and assist or dummy feature. As discussed, substrate 201 may include a semiconductor material in a top portion thereof such as silicon or another suitable semiconductor material. In some embodiments, mask 204 is directly transferred to substrate 201. In such embodiments, mask 204 may be a material having an etch selectivity with respect to substrate 201. In some embodiments, the pattern of mask 204 is first transferred to hardmask material 206 (e.g., from a photoresist mask 204) and the pattern of mask 204 is then transferred to substrate 201. In some embodiments, hardmask material 206 includes silicon and nitrogen (e.g., hardmask material 206 is silicon nitride, SiN). In some embodiments, hardmask material 206 includes silicon and oxygen (e.g., hardmask material 206 is silicon oxide, SiO2). In some embodiments, hardmask material 206 includes silicon, oxygen, and nitrogen (e.g., hardmask material 206 is silicon oxynitride, SiON). In some embodiments, hardmask material 206 includes silicon, carbon, oxygen and nitrogen (e.g., hardmask material 206 is a composite thin film including silicon oxide, silicon carbide, and carbon nitride, SiCON). Other etch selective materials may be used either via hardmask material 206 or mask 204.

Figure 3:
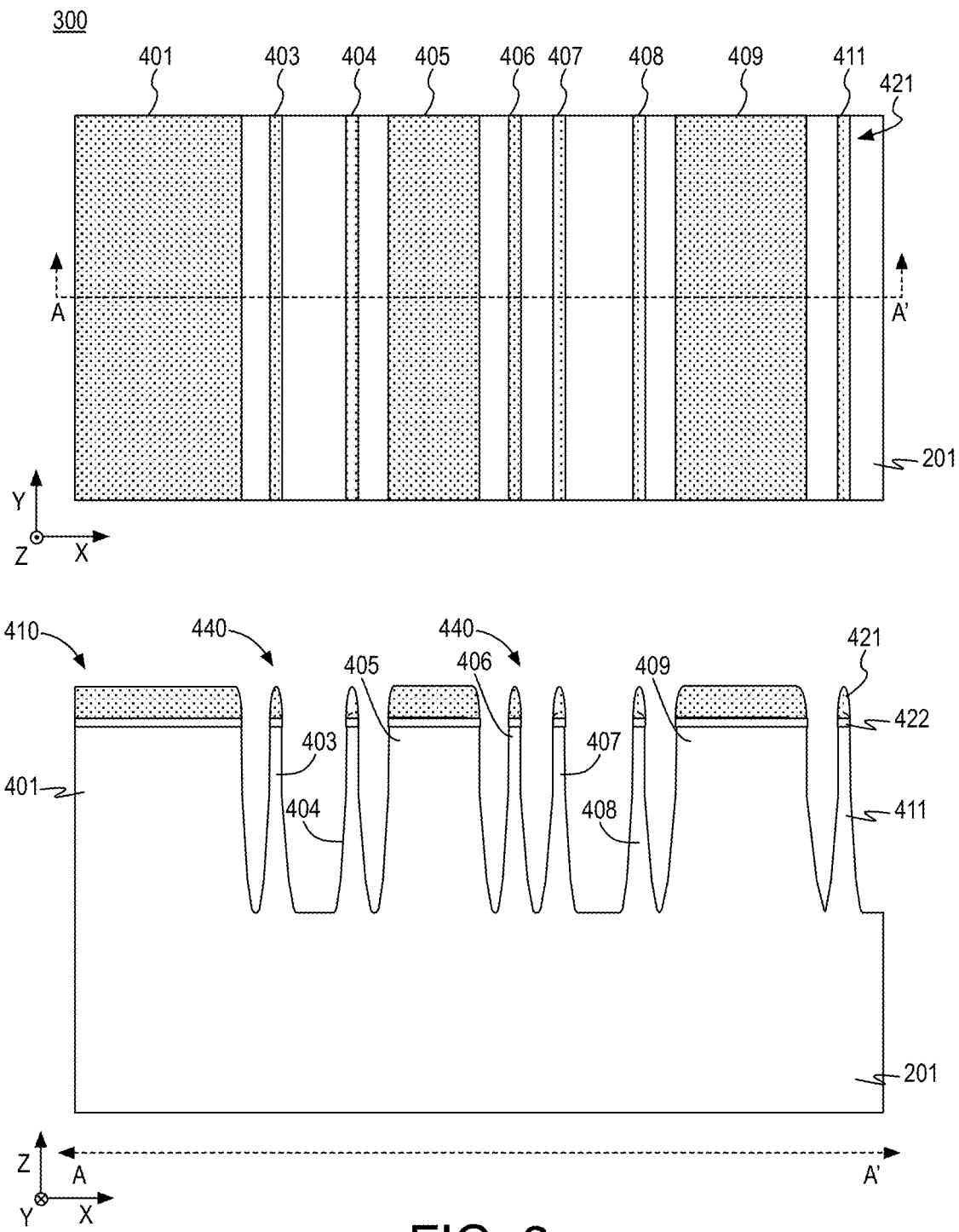
FIG. 3 illustrates an example transistor structure similar to the transistor structure of FIG. 2 after the formation of semiconductor fins and assist features.

FIG. 3 illustrates an example transistor structure 300 similar to transistor structure 200 after the formation of semiconductor fins 440 inclusive of exemplary semiconductor fins 403, 404, 406, 407, 408, 411 and assist features 410 inclusive of assist features 401, 405, 409, 410. In the top-down view of FIG. 3, semiconductor fins 403, 404, 406, 407, 408, 411 and assist features 401, 405, 409, 410 are labeled for the sake of clarity of presentation. Semiconductor fins 440 and assist features 410 may be formed using any suitable technique or techniques such as etch techniques, for example. In the illustrated embodiment, mask 204 may be transferred to hardmask material 206, and the transferred mask is in turn transferred to substrate 201.

Furthermore, as illustrated, semiconductor fins 440 and assist features 410 may include a portion of optional oxide 422 and a portion of hardmask material 421 (or, simply, mask material) thereon. In the following, optional oxide 422 and hardmask material 421 are removed prior to embedding semiconductor fins 440 and assist features 410 in a fill material. For example, hardmask material 421 and optional oxide 422 may be removed using selective etch techniques and semiconductor fins 440 and assist features 410, absent optional oxide 422 and hardmask material 421, may be embedded in a fill material as illustrated herein below. In other embodiments, hardmask material 421 and optional oxide 422 or only optional oxide 422 may remain during such processing.

In some embodiments, semiconductor fins 403, 404, 406, 407, 408, 411 have widths (e.g., taken at a top of semiconductor fins 403, 404, 406, 407, 408, 411 just below optional oxide 422 or hardmask material 421) in the range of 5 to 10 nm and pitches in the range of 10 to 15 nm. Assist features 410 have any suitable width that extends between semiconductor fins 403, 404, 406, 407, 408, 411, as discussed. In some embodiments, assist features have widths that are on the order of 5 to 10 times the width of semiconductor fins 403, 404, 406, 407, 408, 411 such as widths in the range of 25 to 100 nm. In some embodiments, assist features have widths that are on the order of 10 to 200 times the width of semiconductor fins 403, 404, 406, 407, 408, 411 such widths in the range of 40 to 2 um. Larger assist features may be used.

Returning to FIG. 1, as discussed, a number of active semiconductor fins and dummy features are patterned in and over a substrate using EUV. Such semiconductor fins and dummy features may be patterned using direct EUV patterning using the patterned EUV resist as an etch pattern and/or by transferring the patterned EUV to a hardmask and using the patterned hardmask as an etch pattern, as illustrated herein. In any case, the patterned semiconductor fins and dummy features are patterned using EUV lithography deploying an EUV mask or reticle having features representative of semiconductor fins and dummy features. Accordingly, the patterned semiconductor fins and dummy features include a number of active fins to be used as part of transistor structures and additional dummy features that are assist features for improved EUV processing. The pattern of active semiconductor fins may be responsive to a final transistor layout or architecture scheme of the device being manufactured. The pattern of assist features or dummy features may fill in among (e.g., between) the active fins to form a pattern also defined by the final transistor layout or architecture scheme. As discussed, the inclusion of such assist features reduces defect issues in the EUV processing as reticle defects in the mask, that would otherwise be revealed, are obscured by absorber portions used to pattern the assist features.

Processing continues at operation 102, where the semiconductor fins and dummy features are embedded in a fill material by, for example, bulk deposition of the fill material. The fill material may be any suitable material that has etch selectivity with respect to a subsequent hardmask. In some embodiments, the fill material is a flowable oxide material (e.g., the fill material includes oxygen). In some embodiments, the fill material is a carbon hardmask material such as a spin on carbon material inclusive of amorphous carbon (e.g., the fill material includes carbon). The fill material may be deposited using any suitable technique or techniques. In some embodiments, the fill material is deposited using physical vapor deposition (PVD) techniques. In some embodiments, the fill material is deposited using chemical vapor deposition (CVD) techniques.

Figure 4:
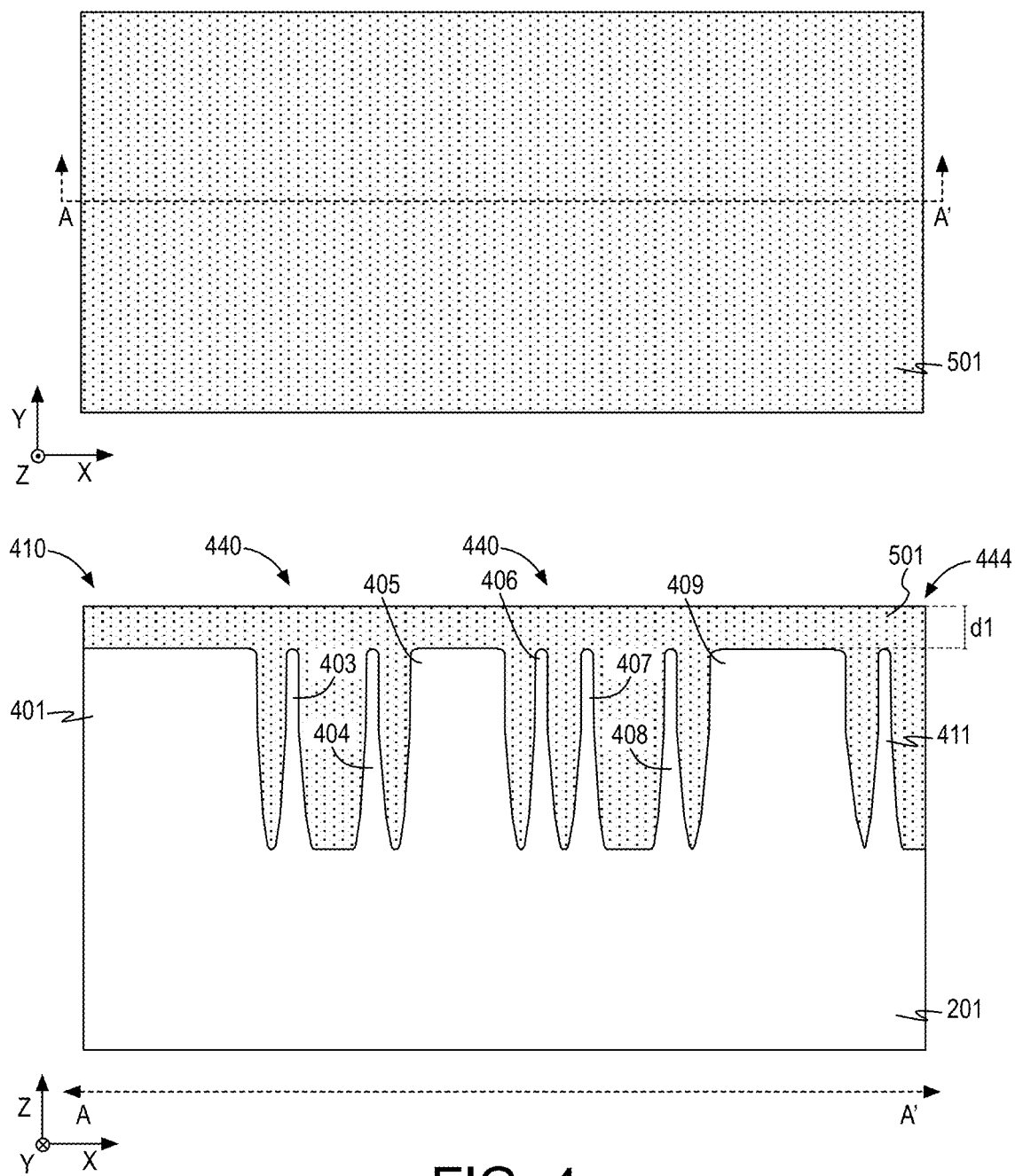
FIG. 4 illustrates an example transistor structure similar to the transistor structure of FIG. 3 after embedding the semiconductor fins and assist features in a fill material.

FIG. 4 illustrates an example transistor structure 400 similar to transistor structure 300 after embedding semiconductor fins 440 and assist features 410 in fill material 501. As shown, fill material 501 extends above semiconductor fins 440 and assist features 410 such that a top surface 444 of fill material is above the tops of semiconductor fins 440 and assist features 410. Fill material 501 fills or substantially fills the voids or openings between adjacent ones of semiconductor fins 440 and assist features 410 and is in contact with exposed portions of substrate 201. Furthermore, fill material 501 extends a distance, d1, above the tops of semiconductor fins 440, such as a distance in the range of about 10 to 100 nm. As used herein, the term embedded indicates one or more objects are under a surface of a material such that no portion of the one or more objects is exposed from the surface of the material. Fill material 501 may be deposited on and over semiconductor fins 440 using any suitable technique or techniques such as CVD, PVD, or application of flowable materials such as flowable oxide materials. Furthermore, a substantially planar top surface 444 of fill material 501 may be provided via the bulk deposition of fill material 501 and/or an optional planarization operation.

Returning to FIG. 1, processing continues at operation 103, where a mask is patterned over the fill material to cover portions of the fill material over semiconductor fins (e.g., active semiconductor fins that are to remain) and to expose portions of the fill material over assist features that are to be removed. The mask may be patterned using any suitable technique or techniques such as EUV lithography techniques. In some embodiments, the mask is directly patterned using lithography techniques. In some embodiments, a hardmask material layer or layers are deposited over the fill material, photoresist layer is patterned over the hardmask material layer using lithography such as EUV lithography, and the pattern is transferred from the photoresist layer to the hardmask. The mask may include any material(s) having etch selectivity with respect to the fill material. In some embodiments, the mask is a nitride hardmask. In some embodiments, the mask is a photoresist material.

Figure 5:
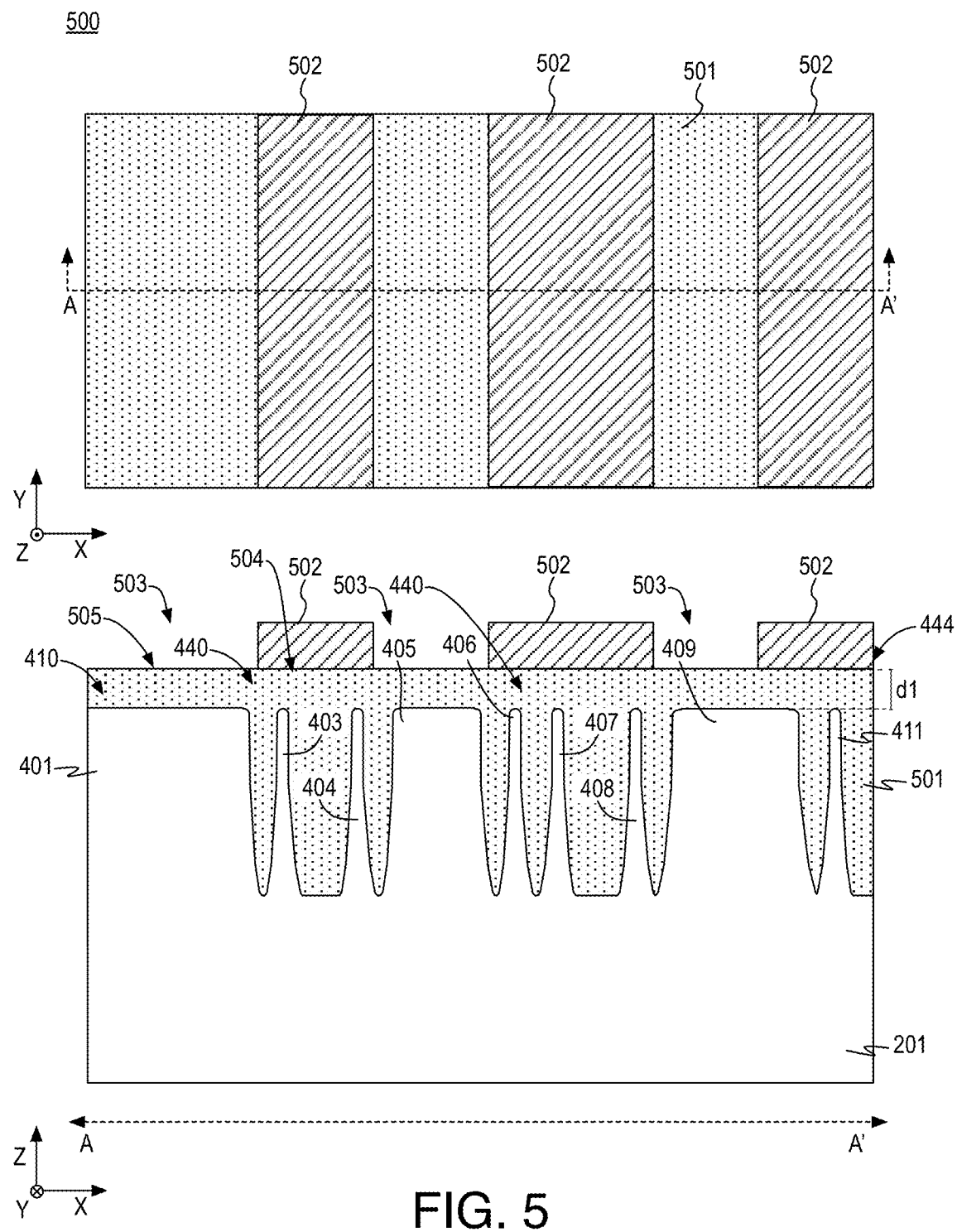
FIG. 5 illustrates an example transistor structure similar to the transistor structure of FIG. 4 after a mask is patterned over the fill material.

FIG. 5 illustrates an example transistor structure 500 similar to transistor structure 400 after a mask 502 is patterned over fill material 501. As discussed, fill material 501 fills or substantially fills the voids or openings between adjacent ones of semiconductor fins 440 and assist features 410 and is in contact with exposed portions of substrate 201. Furthermore, fill material 501 extends a distance, d1 above the tops of semiconductor fins 440 and assist features 410 as discussed with respect to FIG. 4. As shown, subsequent to deposition of fill material 501, mask 502 is patterned over fill material 501 using any suitable technique or techniques such as EUV lithography techniques. As discussed, mask 502 may be a photoresist material or a hardmask material. As shown with respect to portion 504 (or region) of fill material 501 in the side view of FIG. 5, mask 502 covers portions of fill material 501 over active semiconductor fins that are to be preserved inclusive of active semiconductor fins 403, 404, 406, 407, 408, 411. Furthermore, mask 502 has openings 503 that expose portions of fill material 501, as illustrated with respect to portion 505 (or region) of fill material 501, over assist features that are to be removed in subsequent processing inclusive of assist features 401, 405, 409.

Returning to FIG. 1, processing continues at operation 104, where at least a portion of each of the assist features patterned at operation 101 are removed while active semiconductor fins are protected by the patterned mask formed at operation 103. In some embodiments, the assist features under the openings in the mask formed at operation 103 are removed using anisotropic etch processing while the active semiconductor fins under mask portions are protected during the anisotropic etch processing. For example, an anisotropic etch chemistry that selectively etches the fill material deposited at operation 102 and the material of the semiconductor fins patterned at operation 101 selective to the mask patterned at operation 103 is employed to remove exposed assist features while leaving active fins protected. Notably, portions of exposed assist features are removed during the etch processing while active semiconductor fins are protected by the mask and fill material during such selective etch processing. For example, initial etch processing may be used to etch fill material to expose semiconductor assist features and, after the assist features are revealed, the same or alternative etch chemistry may be deployed to remove the exposed semiconductor assist features.

Processing continues at operation 105, where the remaining active semiconductor fins are exposed for subsequent transistor fabrication processing. For example, the mask patterned at operation 103, the remaining fill material deposited at operation 102 (if any), as well as any optional oxide and hardmask material present on the fin are removed. Such materials may be removed using any suitable technique or techniques such as selective etch techniques inclusive of wet and dry etch techniques that selectively etch present ones of the fill material, optional oxide, and hardmask materials selective to the semiconductor material of the active fins. In some embodiments, such processing includes selective removal of nitride materials and oxide materials to the silicon of the semiconductor fins. However, as discussed other material chemistries may be used.

Figure 6:
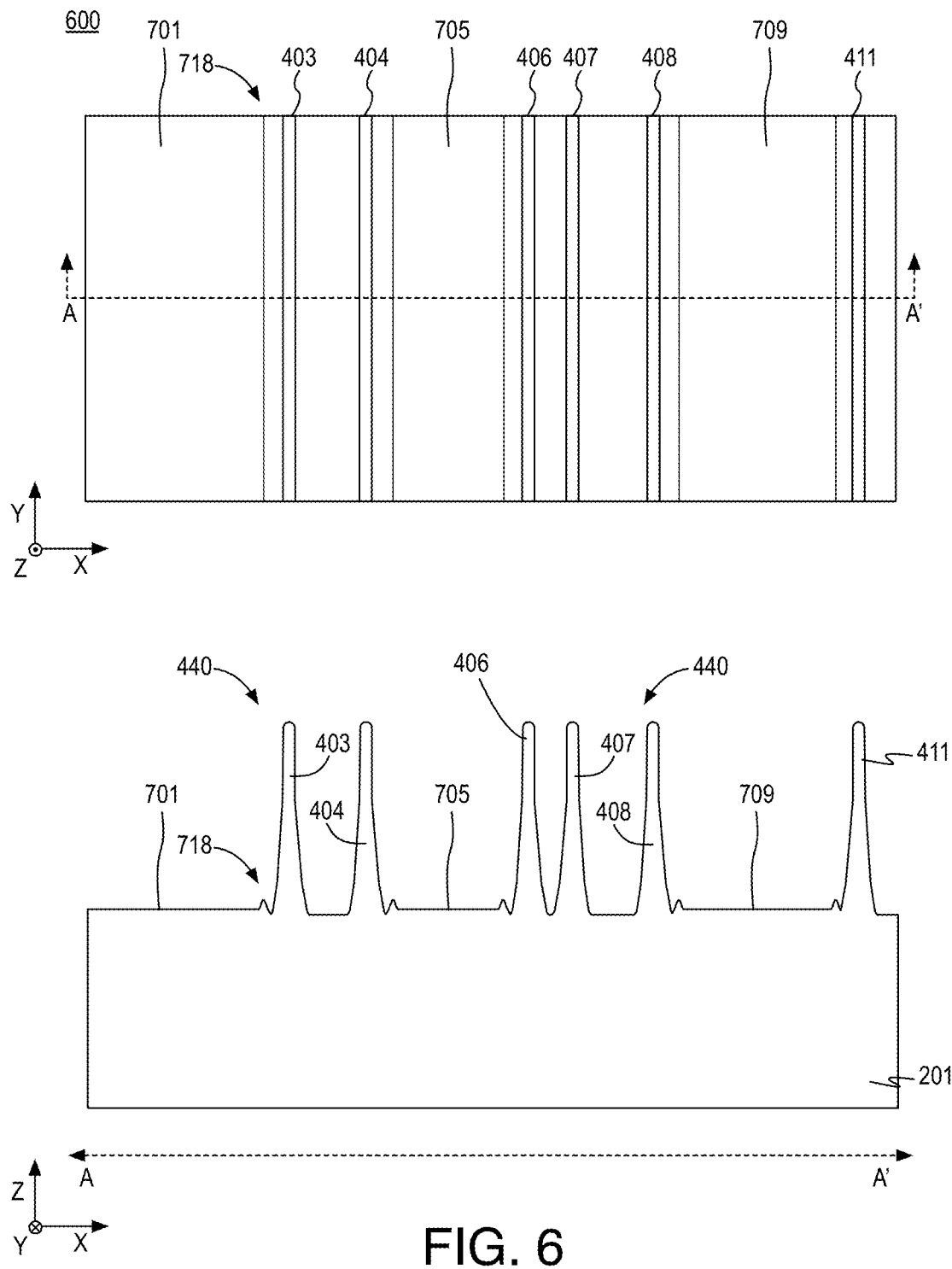
FIG. 6 illustrates an example transistor structure similar the to transistor structure of FIG. 5 after selective etch processing has removed portions of the assist features leaving subfin portions of the assist features.

FIG. 6 illustrates an example transistor structure 600 similar to transistor structure 500 after selective etch processing has removed portions of assist features 401, 405, 409, leaving subfin portions 701, 705, 709 of assist features 401, 405, 409. As used herein, the term subfin indicates a portion of a semiconductor feature at least partially adjacent the substrate side of substrate 201. In some embodiments, the subfin portion is a continuous material with respect to the substrate as shown in FIG. 6 and elsewhere herein. For example, substrate 201 and subfin portions 701, 705, 709 are a continuous material. The term continuous material indicates the portions or regions form an unbroken monolithic whole.

As shown, for assist features 401, 405, 409, such top portions (e.g., portions in the z-direction) are removed and only subfin portions 701, 705, 709 remain. In some embodiments, ridges 718 of portions 701, 705, 709 also remain due to the manner of etching the top portions of assist features 401, 405, 409. Characteristics of such ridges 718 are discussed further herein below and are illustrated in the top-down view of FIG. 6 for the sake of clarity of presentation. In contrast, for semiconductor fins 403, 404, 406, 407, 408, 411, top portions remain. Such top portions may be characterized as fin channels, a fin top region, or, simply, a fin. In some embodiments, the top fin portion is used as a channel for a transistor. Notably, subfin portions 701, 705, 709 are not subsequently contacted by active components of a transistor. As used herein, the term active component of a transistor indicate a component that is used electrically in operation and includes a transistor channel, a transistor gate structure, a transistor source, and a transistor drain, but is not inclusive of adjacent dielectric materials. In some embodiments, subfin portions 701, 705, 709 are buried in a dielectric material on and/or in which the active components of the transistor structures (e.g., gate structures, source structures, and drain structures) are formed. Such transistor structures as well as other features of subfin portions 701, 705, 709 and active semiconductor fins 403, 404, 406, 407, 408, 411 are discussed further herein with respect to FIG. 7.

Returning to FIG. 1, processing continues at operation 106, where the remaining active semiconductor fins are used in transistor fabrication such that a gate structure (e.g., including a gate dielectric and gate electrode) is formed on a semiconductor channel of an active semiconductor fin and a source and drain are formed on the fin or in contact with the semiconductor channel. For example, the semiconductor fin may be replaced by epitaxial source and drain structures. In some embodiments, the resultant transistor structure includes a semiconductor channel fin including a top portion of an active semiconductor fin and the gate contacts two sides and a top of the channel region. In other embodiments, the resultant transistor structure includes a nanoribbon channel etched from semiconductor fin with sacrificial material(s) of the active semiconductor fin being removed during the etch. In such embodiments, the gate contacts all sides (e.g., all around) the nanoribbon channel. In either case, source and drain structures are coupled to the channel using epitaxial growth techniques or other source and drain structures.

In some embodiments, the gate structure and/or source and drain structures formed using such techniques are over regions of the substrate that were previously covered by assist features. In some embodiments, subfin portions remaining from the removal of such assist features are located on or over such regions. For example, the assist features and active fins are patterned and the assist features are removed as discussed. The assist features are removed from a region or portion of the substrate that are then immediately adjacent active fins. In some embodiments, the space or region of the assist features is employed as space for gate, source, and/or drain structures of the subsequently formed transistor structures. As discussed, absent use of the discussed techniques such regions would otherwise be light fields between the desired active fins causing lithography defects and other manufacturing problems.

Figure 7:
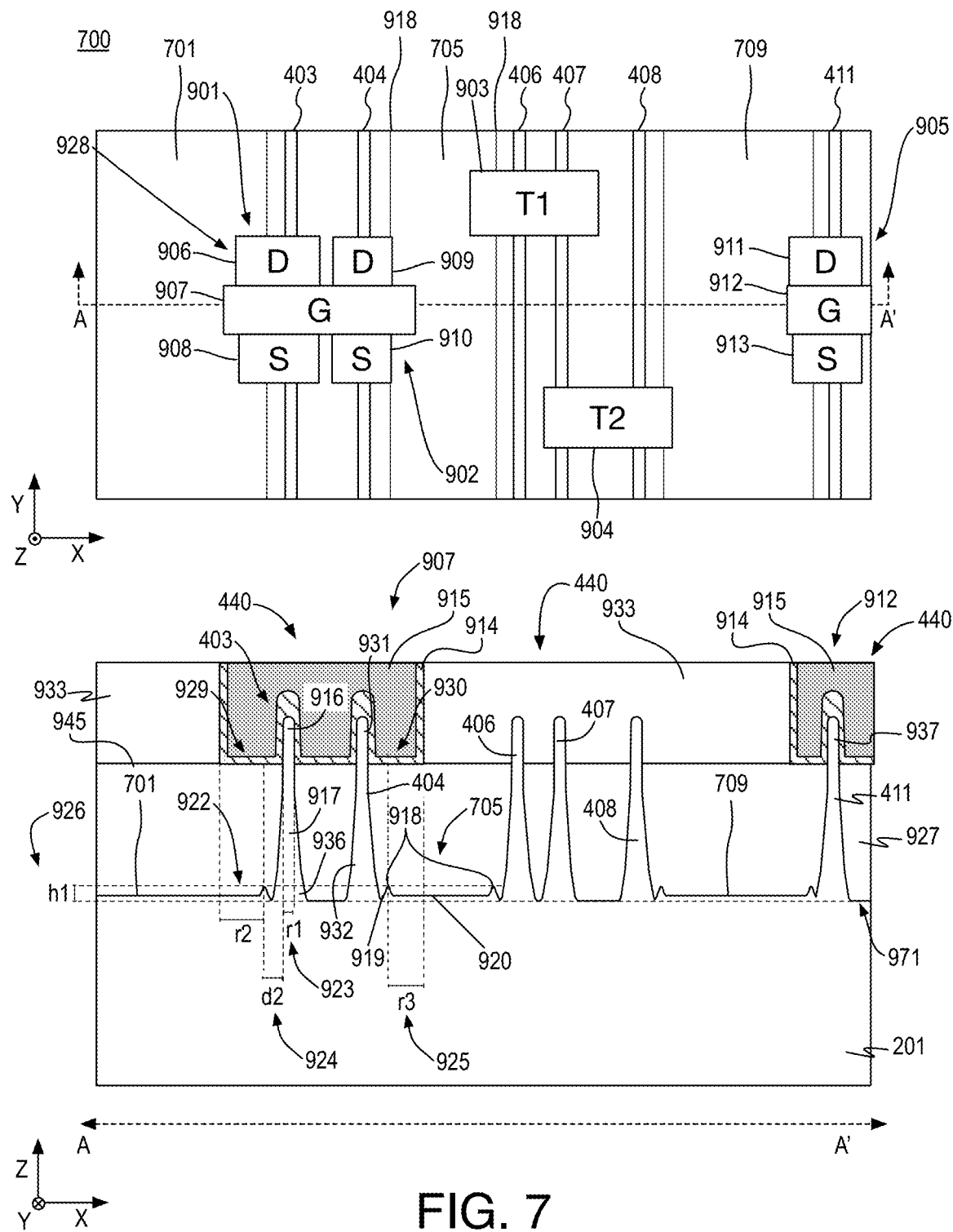
FIG. 7 illustrates an example transistor structure similar to the transistor structure of FIG. 6 after the formation of transistor components on and over active semiconductor fins.

FIG. 7 illustrates an example transistor structure 700 similar to transistor structure 600 after the formation of transistor components on and over active semiconductor fins 403, 404, 406, 407, 408, 411. As shown in FIG. 7, a transistor 901 includes a source 908 (or source structure), a gate 907 (or gate structure), and a drain 906 (or drain structure). A transistor 902 includes a source 910, gate 907 (shared with transistor 901), and a drain 909. A transistor 905 includes a source 913, a gate 912, and a drain 911. Transistor structure 700 further includes transistors 903, 904, which may also each have a source, a drain, and a gate but are illustrated simply as transistors T1, T2 for the sake of clarity of presentation. Transistor structure 700 may include any number of such transistors optionally having shared sources, drains, or gates in any suitable architecture as is known in the art. In the top-down view of FIG. 7, dielectric layer 933 is not shown for the sake of clarity.

As shown in the cross-sectional view, gates 907, 912 may each include a gate dielectric 914 and a gate electrode 915. In the cross-sectional view, gate dielectric 914 is shown with hatching and gate electrode 915 is shown in gray (though gate 907 is shown in the top-down view in white) for the sake of clarity of presentation. Gate dielectric 914 is on channel region 916 of semiconductor fin 403 and channel region 931 of semiconductor fin 404 as well as on top surfaces of dielectric layer 927 and sidewall surfaces of dielectric layer 933. As shown, dielectric layer 927 has a top surface 945 that is above a surface 971 of substrate 201 and below the tops of active semiconductor fins 403, 404, 406, 407, 408, 411 such that top portions of active semiconductor fins 403, 404, 406, 407, 408, 411 above dielectric layer 927 may provide channel regions while subfin or bottom portions of active semiconductor fins 403, 404, 406, 407, 408, 411, below top surface 945 dielectric layer 927 are substantially or at least partially inactive in the operation of transistors 901, 902. For example, active semiconductor fin 403 may include channel region 916 and subfin portion 917 and active semiconductor fin 404 may include channel region 931 and subfin portion 932, and so on. Gate 912 similarly includes gate dielectric 914 (e.g., a high k gate dielectric such as hafnium oxide) and gate electrode 915 (e.g., a gate conductor such as multiple work function metals).

Gate 907 has a portion 929 that is over (e.g., vertically aligned in the z-direction) a region 922, r2, of subfin portion 701. Channel region 916 is over (e.g., vertically aligned in the z-direction) a region 923, r1, of substrate 201. It is noted that at least a portion of subfin portion 917 is also over region 923, r1. In some embodiments, region 922, r2, and region 923, r1, are offset by a lateral distance 924, d2. In some embodiments, lateral distance 924, d2, is in the range of 1 to 5 nm. In a similar manner, gate 907 has a portion 930 that is over (e.g., vertically aligned in the z-direction) a region 925, r3, of subfin portion 705. Channel region 931 is over (e.g., vertically aligned in the z-direction) a region (not labeled) of substrate 201 in a manner similar of that of channel region 916 being over region 923, r1. In some embodiments, region 925, r3, and the region under channel region 931 are offset by a lateral distance as with lateral distance 924, d2, offsetting region 922, r2, and region 923, r1. Also as shown, subfin portion 705 is separated from a base of active semiconductor fin 404 by a portion 919 of surface 971 of substrate 201. Similar relationships may be found between any active semiconductor fins and adjacent subfin portions in transistor structure 700.

In the illustrated embodiment, subfin portions 701, 705, 709 remain after removal of other portions of assist features 401, 405, 409. In some embodiments, one or more of subfin portions 701, 705, 709 each include two ridges as illustrated with respect to ridges 918 of subfin portion 705. As shown, each of ridges 918 has a substantially linear top (e.g., in the y-dimension) that extends at a height 926, h1, above surface 971 of substrate 201. Surface 971 may be defined by the regions between subfin portions 701, 705, 709 and active semiconductor fins 403, 404, 406, 407, 408, 411 and may, with such features removed, be substantially planar at a z-position that is, for example, an average position of those regions with the average position determined, for example, by taking a number of samples z0 heights and averaging them.

Height 926, h1, of ridges 918 of subfin portions 701, 705, 709 above surface 971 may be any suitable height such as a height in the range of 4 to 12 nm. In some embodiments, height 926, h1, is in the range of 4 to 8 nm. In some embodiments, height 926, h1, is in the range of 8 to 12 nm. In some embodiments, height 926, h1, is in the range of 10 to 20 nm. For example, height 926, h1, may be measured at a top portion of ridges 918. As used herein, the term ridge is used in its ordinary meaning to indicate a narrow top of a structure. As shown, ridges 918 are also above an interior region 920 of subfin portion 701. Ridges 918 may be above a low point of interior region 920 by any suitable height (in the z-dimension) such as a height in the range of 1 to 5 nm. Furthermore, interior region 920 may also be above surface 971 by any suitable height (not shown) such as a height in the range of 3 to 12 nm.

In some embodiments, subfin portions 701, 705, 709 do not remain after removal of assist features 401, 405, 409. That is, assist features 401, 405, 409 may be removed in their entirety to provide a surface substantially planar with respect to surface 971 or indentations or valleys below surface 971 may be made in substrate 201. In such embodiments, a portion of assist feature 401 was formed over region 922, r2, a portion of assist feature 405 was formed over region 925, r3, and so on. Subsequent to removal of entireties of or portions of assist features 401, 405, 409, transistor components are formed over such regions. Notably, such transistor components inclusive of gates 907, 912, sources 908, 910, 913, drains 906, 909, 911, and similar components of transistors 903, 904 may be formed over such regions of substrate 201. That is, one or more of gates 907, 912, sources 908, 910, 913, drains 906, 909, 911 may be formed over a region of subfin portions 701, 705, 709 or over regions where assist features 401, 405, 409 were fully removed from. Notably, such regions may be at any depth in substrate 201 such as at surface 971 of substrate 201 or at a region within a depth of substrate 201 below surface 971. The term region in such contexts indicates a planar surface or region at surface 971 of substrate 201 or a horizontal region within a body of substrate 201.

As discussed, and with reference to FIGS. 2-7, semiconductor fins 440 and assist features 410 are formed within and/or over substrate 201 using EUV lithography (e.g., direct print EUV) such that each of semiconductor fins 440 and assist features 410 is over a particular region of substrate 201. Semiconductor fins 440 and assist features 410 are embedded in fill material 501. Mask 502 is patterned over fill material 501 such that mask 502 covers portion 504 of fill material 501 over active semiconductor fins 403, 404 and exposes portion 505 of fill material 501 over assist features 401, 402 such that assist feature 401 is substantially parallel to and immediately adjacent active semiconductor fin 403. An entirety of or a portion of assist feature 402 is then removed such that active semiconductor fin 403 is over region 923, r1, of substrate 201 and assist feature 402 is over region 922, r2, of substrate 201, as shown in FIG. 7. Transistor components are then formed over active semiconductor fin 403 inclusive of gate 907 coupled to active semiconductor fin 403 such that gate 907 includes portion 929 over region 922, r2, of substrate 201. In addition or in the alternative, source 908 and/or drain 906 may be over a portion of region 922, r2, of substrate 201 as shown with respect to region 928 in the top down view.

In some embodiments, gate 907 is also coupled to active semiconductor fin 404 such that gate 907 includes portion 930 over region 925, r3, of substrate 201. In some embodiments, source 910 and drain 909 are not over region 925, r3, of substrate 201 as illustrated. In some embodiments, the region occupied by one of assist features 401, 405, 409 extends along, between, and parallel to any adjacent two of active semiconductor fins as shown with respect to assist feature 409 extending along, between, and parallel to active semiconductor fins 408, 411 and assist feature 405 extending along, between, and parallel to active semiconductor fins 404, 406. In some embodiments, no assist features are provided between adjacent semiconductor fins as the circuit layout does not allow assist features to fit therebetween and/or due to a lack of necessity for high quality EUV printing, as shown with respect to adjacent active semiconductor fins 403, 404 and adjacent active semiconductor fins 406, 407, 408.

As shown, transistor structure 700 includes semiconductor channel 916 over region 923, r1, of substrate 201, subfin portion 701 (e.g., subfin structure) substantially parallel to semiconductor channel 916 and region 922, r2, of substrate 201 and separated from region 923, r1, by lateral distance 924, d2 such that subfin portion 701 (e.g., subfin structure) and substrate 201 are a continuous material such as silicon, gate 907 coupled to semiconductor channel 916 over region 923, r1, such that portion 929 of gate 907 is over subfin portion 701 (e.g., subfin structure) region 922, r2, of substrate 201, and source 908, and drain 906 opposite gate 907 from source 908. Also as shown, a portion of source 908 and/or drain 906 are over subfin portion 701 (e.g., subfin structure). Furthermore, transistor structure 700 includes semiconductor channel 931 substantially parallel to and adjacent semiconductor channel 916 opposite subfin portion 701 (e.g., subfin structure) and subfin portion 705 (e.g., subfin structure) substantially parallel to semiconductor channel 931, such that gate 907 is coupled to semiconductor channel 931 and includes portion 930 over subfin portion 705 (e.g., subfin structure). As used herein, two components being over one another indicates that they are vertically aligned (e.g., in the z-dimension) such that if at the same z-height, they would at least partially overlap vertically (e.g., in the x-y plane).

Also as shown, semiconductor channel 916 is a top fin portion of active semiconductor fin 403 (e.g., a fin structure), and active semiconductor fin 403 further includes subfin portion 917 (e.g., a subfin) below the top fin portion with subfin portion 917 (e.g., subfin) including a portion 936 laterally co-planar with subfin portion 701 (e.g., subfin structure). As used herein, the term laterally indicates a direction substantially planar with respect to substrate 201 and orthogonal to the z-dimension. Transistor structure 700 further includes dielectric layer 927 (e.g., a dielectric material) vertically between subfin portion 701 (e.g., subfin structure) and portion 929 of gate 907 and laterally between subfin portion 701 (e.g., subfin structure) and portion 936.

In the illustrated embodiment, transistors 901, 902, 903, 904, 905 employ channel region(s) that are a top portion of a continuous semiconductor fin as illustrated with respect to channel region 916 of semiconductor fin 403 and others. For example, active semiconductor fin 403 may include channel region 916 (which may also be characterized as a top portion) and subfin portion 917. In some embodiments, channel region 916 may be characterized simply as a fin that is over subfin portion 917. In some embodiments, subfin portion 917 is the portion of active semiconductor fin 403 adjacent dielectric layer 927 and channel region 916 is the portion of active semiconductor fin 403 over dielectric layer 927.

In other embodiments, transistors 901, 902, 903, 904, 905 employ channel region(s) that are nanoribbons (or nanosheets) formed from active semiconductor fins 403, 404, 406, 407, 408, 411. In such embodiments, active semiconductor fins 403, 404, 406, 407, 408, 411 include multi-layer stacks of channel semiconductor (e.g., silicon, Si) and a sacrificial material that may also be a semiconductor (e.g., silicon germanium, SiGe). During fabrication, the sacrificial material is removed, leaving one or more nanoribbons (or nanosheets) to be contacted by an all around gate. Such processing is known in the art and may include forming a sacrificial gate/sidewall structure over active semiconductor fin 403, removing fin portions not covered by the sacrificial gate/sidewall structure, recessing exposed portions of the sacrificial material of active semiconductor fin 403, epitaxially growing source and drain materials on opposite sides of the remaining fin portion under the sacrificial gate/sidewall structure, removing the sacrificial gate, removing the remaining sacrificial material of active semiconductor fin 403 (leaving nanoribbons of channel material), forming a gate dielectric on the nanoribbons of channel material (e.g., via atomic layer deposition), and forming a gate electrode on the gate dielectric. For example, semiconductor channel region 916 may be a nanoribbon (fabricated as discussed or using alternative techniques) and gate 907 may be a gate all around gate structure surrounding semiconductor channel region 916. The same may be the case for channel region 931, a channel region 937 of active semiconductor fin 411, and other channel regions.

Figure 8:
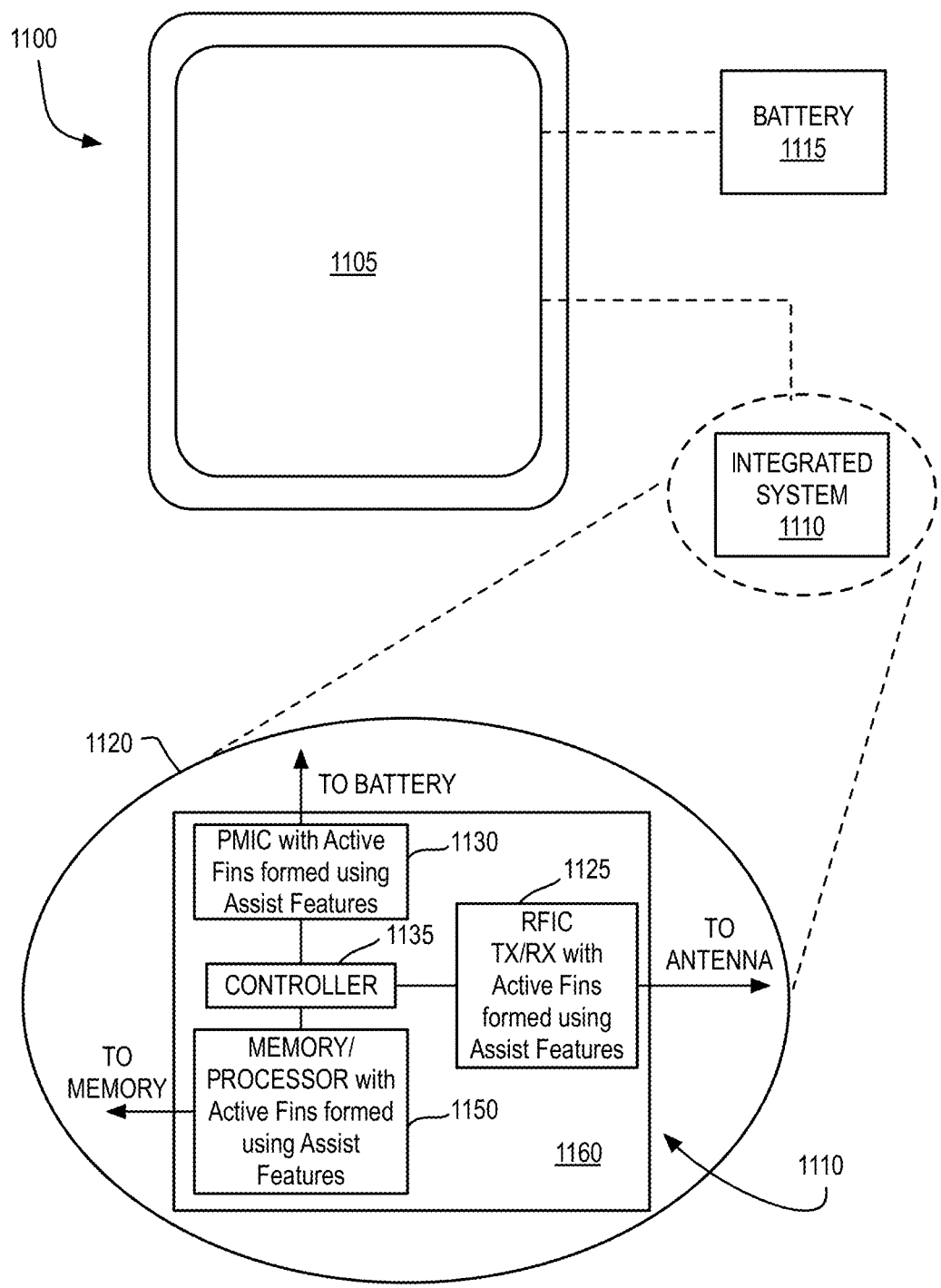
FIG. 8 is an illustrative diagram of a mobile computing platform employing a device having active semiconductor fins generated using EUV assist features.

FIG. 8 is an illustrative diagram of a mobile computing platform 1100 employing a device having active semiconductor fins generated using EUV assist features, arranged in accordance with at least some implementations of the present disclosure. Any die or device having a transistor structure inclusive of any components, materials, or characteristics discussed herein may be implemented by any component of mobile computing platform 1100. Mobile computing platform 1100 may be any portable device configured for each of electronic data display, electronic data processing, wireless electronic data transmission, or the like. For example, mobile computing platform 1100 may be any of a tablet, a smart phone, a netbook, a laptop computer, etc. and may include a display screen 1105, which in the exemplary embodiment is a touchscreen (e.g., capacitive, inductive, resistive, etc. touchscreen), a chip-level (system on chip—SoC) or package-level integrated system 1110, and a battery 1115. Battery 1115 may include any suitable device for providing electrical power such as a device consisting of one or more electrochemical cells and electrodes to couple to an outside device. Mobile computing platform 1100 may further include a power supply to convert a source power from a source voltage to one or more voltages employed by other devices of mobile computing platform 1100.

Integrated system 1110 is further illustrated in the expanded view 1120. In the exemplary embodiment, packaged device 1150 (labeled "Memory/Processor" in FIG. 11) includes at least one memory chip (e.g., RAM), and/or at least one processor chip (e.g., a microprocessor, a multi-core microprocessor, or graphics processor, or the like). In an embodiment, the package device 1150 is a microprocessor including an SRAM cache memory. As shown, device 1150 may employ a die or device having any transistor structures and/or related characteristics discussed herein. Packaged device 1150 may be further coupled to (e.g., communicatively coupled to) a board, a substrate, or an interposer 1160 along with, one or more of a power management integrated circuit (PMIC) 1130, RF (wireless) integrated circuit (RFIC) 1125 including a wideband RF (wireless) transmitter and/or receiver (TX/RX) (e.g., including a digital baseband and an analog front end module further comprises a power amplifier on a transmit path and a low noise amplifier on a receive path), and a controller 1135 thereof. In general, packaged device 1150 may be also be coupled to (e.g., communicatively coupled to) display screen 1105. As shown, one or both of PMIC 1130 and/or RFIC 1125 may employ a die or device having any transistor structures and/or related characteristics discussed herein.

Functionally, PMIC 1130 may perform battery power regulation, DC-to-DC conversion, etc., and so has an input coupled to battery 1115 and with an output providing a current supply to other functional modules. In an embodiment, PMIC 1130 may perform high voltage operations. As further illustrated, in the exemplary embodiment, RFIC 1125 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of packaged device 1150 or within a single IC (SoC) coupled to the package substrate of the packaged device 1150.

Figure 9:
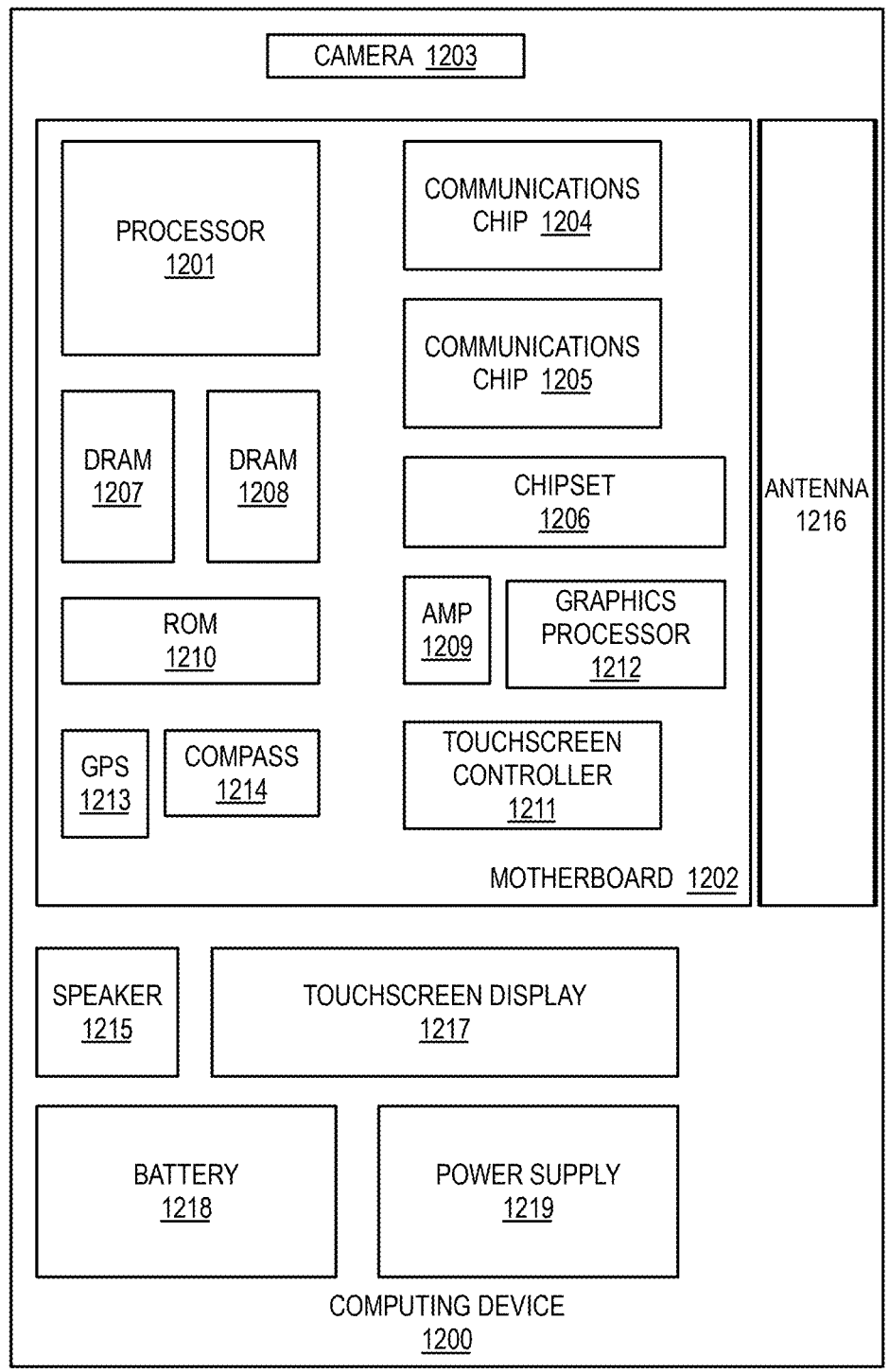
FIG. 9 is a functional block diagram of a computing device, all arranged in accordance with at least some implementations of the present disclosure.

FIG. 9 is a functional block diagram of a computing device 1200, arranged in accordance with at least some implementations of the present disclosure. Any component of computing device 1200 may include a transistor structure having active semiconductor fins generated using EUV assist features. Computing device 1200 may be found inside platform 1100, for example, and further includes a motherboard 1202 hosting a number of components, such as but not limited to a processor 1201 (e.g., an applications processor) and one or more communications chips 1204, 1205. Processor 1201 may be physically and/or electrically coupled to motherboard 1202. In some examples, processor 1201 includes an integrated circuit die packaged within the processor 1201. In general, the term "processor" may refer to any device or portion of a device that processes electronic data from registers and/or memory to transform that electronic data into other electronic data that may be stored in registers and/or memory. Any one or more device or component of computing device 1200 may include a die or device having any transistor structures and/or related characteristics discussed herein as discussed herein.

In various examples, one or more communication chips 1204, 1205 may also be physically and/or electrically coupled to the motherboard 1202. In further implementations, communication chips 1204 may be part of processor 1201. Depending on its applications, computing device 1200 may include other components that may or may not be physically and electrically coupled to motherboard 1202. These other components may include, but are not limited to, volatile memory (e.g., DRAM) 1207, 1208, non-volatile memory (e.g., ROM) 1210, a graphics processor 1212, flash memory, global positioning system (GPS) device 1213, compass 1214, a chipset 1206, an antenna 1216, a power amplifier 1209, a touchscreen controller 1211, a touchscreen display 1217, a speaker 1215, a camera 1203, a battery 1218, and a power supply 1219, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like.

Communication chips 1204, 1205 may enable wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1204, 1205 may implement any of a number of wireless standards or protocols, including but not limited to those described elsewhere herein. As discussed, computing device 1200 may include a plurality of communication chips 1204, 1205. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. Furthermore, power supply 1219 may convert a source power from a source voltage to one or more voltages employed by other devices of mobile computing platform 1100. In some embodiments, power supply 1219 converts an AC power to DC power. In some embodiments, power supply 1219 converts an DC power to DC power at one or more different (lower) voltages. In some embodiments, multiple power supplies are staged to convert from AC to DC and then from DC at a higher voltage to DC at a lower voltage as specified by components of computing device 1200.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

In one or more first embodiments, a method of fabricating an integrated circuit comprises patterning a plurality of semiconductor fins and one or more assist features in a substrate using extreme ultraviolet (EUV) lithography, embedding the semiconductor fins and the one or more assist features in a fill material, forming a mask over the fill material, such that the mask covers a first portion of the fill material over a first semiconductor fin and exposes a second portion of the fill material over a first assist feature, the first assist feature substantially parallel to and immediately adjacent the first semiconductor fin, removing at least a portion of the first assist feature, such that the first semiconductor fin is over a first region of the substrate and the first assist feature is over a second region of the substrate, and forming a gate coupled to the first semiconductor fin, such that at least a portion of the gate is over at least a portion of the second region of the substrate.

In one or more second embodiments, further to the first embodiment, the method further comprises forming a source and drain, such that a portion of the source or the drain is over at least a second portion of the second region of the substrate.

In one or more third embodiments, further to the first or second embodiments, said removing the portion of the first assist feature further comprises removing at least a portion of a second assist feature over a third region of the substrate, the second assist feature substantially parallel to and immediately adjacent a second semiconductor fin substantially parallel to and immediately adjacent the first semiconductor fin opposite the first assist feature.

In one or more fourth embodiments, further to any of the first through third embodiments, at least a second portion of the gate is over the third region of the substrate.

In one or more fifth embodiments, further to any of the first through fourth embodiments, said removing at least the portion of the first assist feature removes an entirety of a top portion of the first assist feature, leaving a second portion of the first assist feature above an adjacent region of the substrate.

In one or more sixth embodiments, further to any of the first through fifth embodiments, the second portion of the first assist features comprises first and second ridges above the adjacent region of the substrate and above a surface between the first and second ridges.

In one or more seventh embodiments, further to any of the first through sixth embodiments, the first semiconductor fin has a width of not more than 10 nm and the first assist feature has a width of not less than 100 nm.

In one or more eighth embodiments, further to any of the first through seventh embodiments, the first fin comprises a multi-layer stack of material layers, the method further comprises etching one or more layers from the multi-layer stack, and the gate comprises a gate all around gate structure surrounding at least one remaining layer of the multi-layer stack.

In one or more ninth embodiments, further to any of the first through eighth embodiments, patterning the plurality of semiconductor fins comprises direct EUV patterning a pattern of the plurality of semiconductor fins, transferring the pattern to a hardmask, and forming the plurality of semiconductor fins by etching the substrate using the patterned hardmask as an etch mask.

In one or more tenth embodiments, further to any of the first through ninth embodiments, the fill material comprises a flowable oxide material and the mask comprises a hardmask patterned using a resist mask.

In one or more eleventh embodiments, a transistor structure comprises a semiconductor channel over a first region of a substrate, a subfin structure substantially parallel to the semiconductor channel and over a second region of the substrate separated from the first region by a lateral distance, the subfin structure and the substrate comprising a continuous material, a gate structure coupled to the semiconductor channel over the first region, such that a portion of the gate structure is over at least a portion of the subfin structure and the second region of the substrate, and a source, and a drain opposite the gate structure from the source.

In one or more twelfth embodiments, further to the eleventh embodiment, a portion of the source or the drain is over at least a second portion of the subfin structure.

In one or more thirteenth embodiments, further to the eleventh or twelfth embodiments, the transistor structure further comprises a second semiconductor channel substantially parallel to and adjacent the semiconductor channel opposite the subfin structure and a second subfin structure substantially parallel to the second semiconductor channel, such that the gate structure is coupled to the second semiconductor channel and comprises a second portion over at least a portion of the second subfin structure.

In one or more fourteenth embodiments, further to any of the eleventh through thirteenth embodiments, the semiconductor channel comprises a top fin portion of a fin structure, the fin structure further comprising a subfin below the top fin portion, the subfin comprising a portion laterally co-planar with the subfin structure.

In one or more fifteenth embodiments, further to any of the eleventh through fourteenth embodiments, the transistor structure further comprises a dielectric material vertically between the subfin structure and the portion of the gate structure over the subfin structure and laterally between the subfin structure and the subfin portion laterally co-planar with the subfin structure.

In one or more sixteenth embodiments, further to any of the eleventh through fifteenth embodiments, the subfin portion comprises first and second ridges above an adjacent region of the substrate and above a surface between the first and second ridges.

In one or more seventeenth embodiments, further to any of the eleventh through sixteenth embodiments, the semiconductor channel comprises a nanoribbon and the gate structure comprises a gate all around gate structure surrounding the nanoribbon.

In one or more eighteenth embodiments, a system comprises a power supply and an integrated circuit die coupled to the power supply, the integrated circuit die comprising a semiconductor channel over a first region of a substrate, a subfin structure substantially parallel to the semiconductor channel and over a second region of the substrate separated from the first region by a lateral distance, the subfin structure and the substrate comprising a continuous material, a gate structure coupled to the semiconductor channel over the first region, such that a portion of the gate structure is over at least a portion of the subfin structure and the second region of the substrate, and a source, and a drain opposite the gate structure from the source.

In one or more nineteenth embodiments, further to the eighteenth embodiment, the integrated circuit die of the system further comprises a second semiconductor channel substantially parallel to and adjacent the semiconductor channel opposite the subfin structure and a second subfin structure substantially parallel to the second semiconductor channel, such that the gate structure is coupled to the second semiconductor channel and comprises a second portion over at least a portion of the second subfin structure.

In one or more twentieth embodiments, further to the eighteenth or nineteenth embodiments, the semiconductor channel comprises a top fin portion of a fin structure, the fin structure further comprising a subfin below the top fin portion, the subfin comprising a portion laterally co-planar with the subfin structure, such that the integrated circuit die further comprises a dielectric material vertically between the subfin structure and the portion of the gate structure over the subfin structure and laterally between the subfin structure and the subfin portion laterally co-planar with the subfin structure.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A method of fabricating an integrated circuit, comprising:
    patterning a plurality of semiconductor fins and one or more assist features in a substrate using extreme ultraviolet (EUV) lithography;
    embedding the semiconductor fins and the one or more assist features in a fill material;
    forming a mask over the fill material, wherein the mask covers a first portion of the fill material over a first semiconductor fin and exposes a second portion of the fill material over a first assist feature, the first assist feature substantially parallel to and immediately adjacent the first semiconductor fin, wherein the first semiconductor fin has a lateral width of not more than 10 nm and the first assist feature has a lateral width of not less than 100 nm;
    removing at least a portion of the first assist feature, wherein the first semiconductor fin is over a first region of the substrate and the first assist feature is over a second region of the substrate, wherein removing at least the portion of the first assist feature removes an entirety of a top portion of the first assist feature, leaving a second portion of the first assist feature extending above an adjacent region of the substrate, wherein the second portion of the first assist feature comprises a first ridge, a second ridge, and a surface between the first ridge and the second ridge, wherein the surface is above the adjacent region of the substrate, and wherein the first ridge and the second ridge are each above the surface; and
    forming a gate coupled to the first semiconductor fin, wherein at least a portion of the gate is over at least a portion of the second region of the substrate.

2. The method of claim 1, further comprising forming a source and drain, wherein a portion of the source or the drain is over at least a second portion of the second region of the substrate.

3. The method of claim 1, wherein said removing the portion of the first assist feature further comprises removing at least a portion of a second assist feature over a third region of the substrate, the second assist feature substantially parallel to and immediately adjacent a second semiconductor fin substantially parallel to and immediately adjacent the first semiconductor fin opposite the first assist feature.

4. The method of claim 1, wherein the first semiconductor fin comprises a multi-layer stack of material layers, the method further comprises etching one or more layers from the multi-layer stack, and the gate comprises a gate all around gate structure surrounding at least one remaining layer of the multi-layer stack.

5. The method of claim 1, wherein patterning the plurality of semiconductor fins comprises direct EUV patterning a pattern of the plurality of semiconductor fins, transferring the pattern to a hardmask, and forming the plurality of semiconductor fins by etching the substrate using the patterned hardmask as an etch mask.

6. The method of claim 1, wherein the surface is above the adjacent region of the substrate by not less than 3 nm, and the each of the first ridge and the second ridge are above the surface by not less than 1 nm.

7. The method of claim 6, wherein the first ridge and the first semiconductor fin are separated by a lateral distance of not more than 5 nm.

8. A method of fabricating an integrated circuit, comprising:
    patterning a plurality of semiconductor fins and one or more assist features in a substrate using extreme ultraviolet (EUV) lithography;
    embedding the semiconductor fins and the one or more assist features in a fill material;
    forming a mask over the fill material, wherein the mask covers a first portion of the fill material over a first semiconductor fin and exposes a second portion of the fill material over a first assist feature, the first assist feature substantially parallel to and immediately adjacent the first semiconductor fin, wherein the first assist feature has a lateral width of not less than five times a lateral width of the first semiconductor fin;
    removing at least a portion of the first assist feature, wherein removing at least the portion of the first assist feature removes an entirety of a top portion of the first assist feature, leaving a second portion of the first assist feature extending above an adjacent region of the substrate, wherein the second portion of the first assist feature comprises a first ridge, a second ridge, and a surface between the first ridge and the second ridge, wherein the surface is above the adjacent region of the substrate, and wherein the first ridge and the second ridge are each above the surface; and
    forming a gate coupled to the first semiconductor fin.

9. The method of claim 8, wherein the lateral width of the first assist feature is not less than ten times the lateral width of the first semiconductor fin.

10. The method of claim 8, wherein the first semiconductor fin comprises a multi-layer stack of material layers, the method further comprises etching one or more layers from the multi-layer stack, and the gate comprises a gate all around gate structure surrounding at least one remaining layer of the multi-layer stack.

11. The method of claim 8, wherein the surface is above the adjacent region of the substrate by not less than 3 nm, and the each of the first ridge and the second ridge are above the surface by not less than 1 nm.

12. The method of claim 11, wherein the first ridge and the first semiconductor fin are separated by a lateral distance of not more than 5 nm.

13. A method of fabricating an integrated circuit, comprising:
patterning a plurality of semiconductor fins and one or more assist features in a substrate using extreme ultraviolet (EUV) lithography;
embedding the semiconductor fins and the one or more assist features in a fill material;
forming a mask over the fill material, wherein the mask covers a first portion of the fill material over a first semiconductor fin and exposes a second portion of the fill material over a first assist feature, the first assist feature substantially parallel to and immediately adjacent the first semiconductor fin;
removing at least a top portion of the first assist feature, wherein removing the top portion of the first assist feature removes an entirety of the top portion of the first assist feature, leaving a bottom portion of the first assist feature extending above an adjacent region of the substrate, wherein the bottom portion of the first assist feature comprises a first ridge, a second ridge, and a surface between the first ridge and the second ridge, wherein the surface is above the adjacent region of the substrate, and wherein the first ridge and the second ridge are each above the surface; and
forming a gate coupled to the first semiconductor fin.

14. The method of claim 13, wherein the first assist feature has a lateral width of not less than ten times a lateral width of the first semiconductor fin.

15. The method of claim 13, wherein the first semiconductor fin comprises a multi-layer stack of material layers, the method further comprises etching one or more layers from the multi-layer stack, and the gate comprises a gate all around gate structure surrounding at least one remaining layer of the multi-layer stack.

16. The method of claim 13, wherein patterning the plurality of semiconductor fins comprises direct EUV patterning a pattern of the plurality of semiconductor fins, transferring the pattern to a hardmask, and forming the plurality of semiconductor fins by etching the substrate using the patterned hardmask as an etch mask.

17. The method of claim 13, further comprising forming a source and drain, wherein a portion of the source or the drain is over the first ridge.

18. The method of claim 13, wherein said removing at least the top portion of the first assist feature further comprises removing at least a portion of a second assist feature, the second assist feature substantially parallel to and immediately adjacent a second semiconductor fin substantially parallel to and immediately adjacent the first semiconductor fin opposite the first assist feature.

19. The method of claim 13, wherein the surface is above the adjacent region of the substrate by not less than 3 nm, and the each of the first ridge and the second ridge are above the surface by not less than 1 nm.

20. The method of claim 19, wherein the first ridge and the first semiconductor fin are separated by a lateral distance of not more than 5 nm.

* * * * *